(12) United States Patent
Lee et al.

(10) Patent No.: US 7,179,744 B2
(45) Date of Patent: Feb. 20, 2007

(54) METHOD FOR FABRICATING SEMICONDUCTOR DEVICE

(75) Inventors: Sung-Kwon Lee, Ichon-shi (KR); Min-Suk Lee, Ichon-shi (KR); Sang-Ik Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 769 days.

(21) Appl. No.: 10/617,182

(22) Filed: Jul. 11, 2003

(65) Prior Publication Data

US 2004/0127058 A1 Jul. 1, 2004

(30) Foreign Application Priority Data

Dec. 26, 2002 (KR) ........... 10-2002-0084231
Dec. 26, 2002 (KR) ........... 10-2002-0084493
Dec. 26, 2002 (KR) ........... 10-2002-0084502

(51) Int. Cl.
*H01L 21/302* (2006.01)
*C09K 13/00* (2006.01)

(52) U.S. Cl. ........... 438/689; 438/704; 438/706; 438/745; 252/79.1; 252/79.4

(58) Field of Classification Search ........... 438/689, 438/704, 706, 745; 252/79.1, 79.4
See application file for complete search history.

(56) References Cited

U.S. PATENT DOCUMENTS 6,458,655 B1* 10/2002 Yuzuriha et al. ........... 438/257

6,531,758 B2* 3/2003 Shin et al. ........... 257/536
6,573,168 B2* 6/2003 Kim et al. ........... 438/586

FOREIGN PATENT DOCUMENTS

KR 1020020054677 7/2002
KR 1020020054678 7/2002

* cited by examiner

*Primary Examiner*—Nadine G. Norton
*Assistant Examiner*—Lynette T. Umez-Eronini
(74) *Attorney, Agent, or Firm*—Mayer Brown Rowe & Maw LLP (57) ABSTRACT

A method for fabricating a semiconductor device includes the steps of: (a) forming a plurality of conductive patterns on a substrate in a cell region and a peripheral circuit region; (b) forming an insulation layer on an entire surface of the resulting structure from the step. (a); (c) forming a plurality of plugs in the cell region and simultaneously forming a dummy pattern in a region between the cell region and the peripheral circuit region, each plug and the dummy pattern being contacted to the substrate allocated between the conductive patterns by passing through the insulation layer; (d) forming a photoresist pattern masking the resulting structure in the cell region; and (e) removing the insulation layer in the peripheral circuit region by performing a wet etching process with use of the photoresist pattern as an etch mask to thereby expose a surface of the substrate in the peripheral circuit region.

15 Claims, 11 Drawing Sheets

METHOD FOR FABRICATING SEMICONDUCTOR DEVICE

FIELD OF THE INVENTION

The present invention relates to a method for fabricating a semiconductor device; and, more particularly, to a method for fabricating a semiconductor device capable of preventing diffusions of a wet solution used in a wet etching process into an unintended region.

DESCRIPTION OF RELATED ARTS

As an integration level of a semiconductor device has been highly progressed, it is difficult to secure process margins. To solve this problem, a self-aligned contact (SAC) process is adopted for forming a contact in a cell region. However, a bottom side area of the contact inevitably decreases while an aspect ratio increases as the integration level increases. This increase of the aspect ratio causes the contact area to be decreased in more extents.

Therefore, a wet etching process is employed after the contact is formed in the cell region through the use of the typical SAC process in order to secure a maximal area of an opened portion of the contact. However, this wet etching process etches partially an insulation layer usually made of boron-phosphorus-silicate glass (BPSG).

Figure 1A:
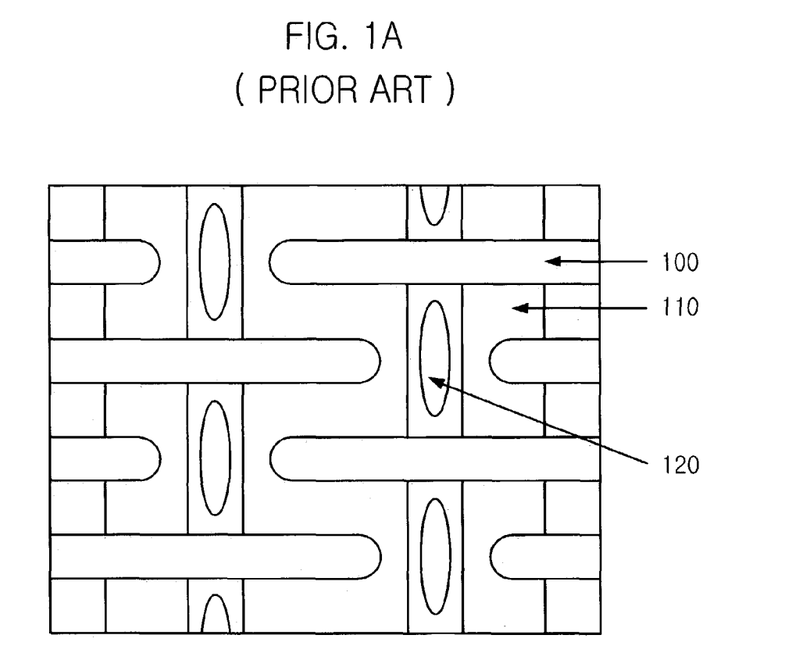
FIGS. 1A and 1B are top views of a conventional semiconductor device before and after a wet cleaning/etching process for extending an opened portion of a contact hole.
Figure 1B:
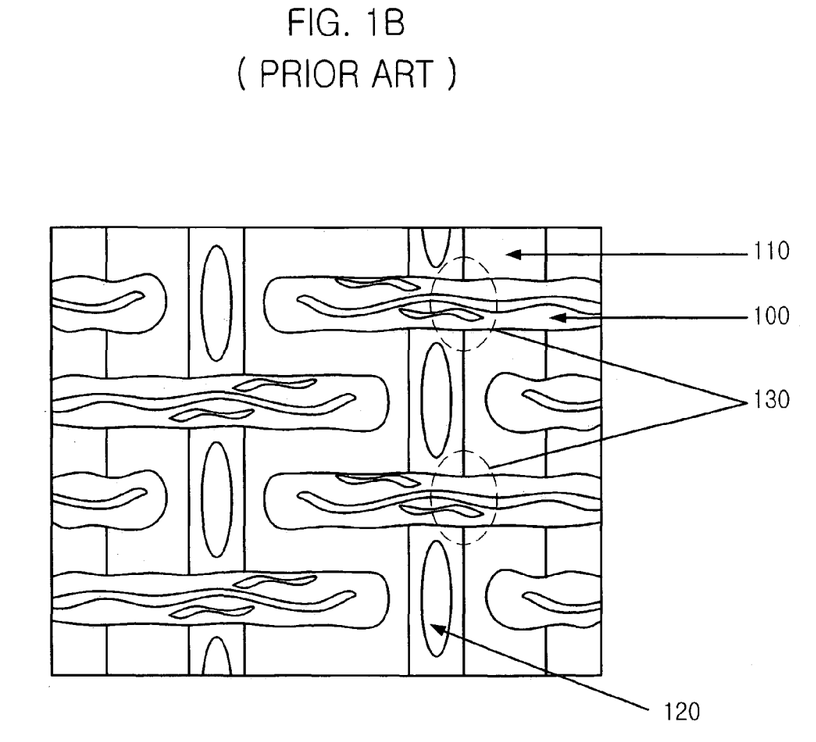

FIGS. 1A and 1B are top views of a conventional semiconductor device before and after a wet cleaning/etching process for extending an opened portion of a contact after the typical SAC process is performed.

Prior to performing the wet etching process, a plurality of contact holes 120 are formed between conductive patterns 110. A plurality of insulating patterns 100 are formed adjacent to the contact holes 120 in a direction of crossing the conductive patterns 110. Herein, the conductive pattern 110 can be a gate electrode pattern, a bit line pattern or a metal wire. Also, the conductive pattern 110 is a line-type conductive pattern.

At this time, the wet etching process usually uses hydrofluoric acid (HF)-based solutions with a consideration of an etch characteristic of the oxide-based insulating pattern 100. However, this use of the HF-based solution results in a corrosion of the insulating pattern 100, thereby degrading overall insulating characteristics of the semiconductor device.

In case of fabricating a dynamic random access memory (DRAM) device, a contact hole is formed in a cell region and a plug being electrically connected to a source/drain region through the contact hole is formed by using a selective epitaxial growth (SEG) technique or a deposition technique. Afterwards, a post landing plug source drain (PLSD) process is performed in a peripheral circuit region.

However, because of a recent trend in large-scale integration of the semiconductor device, the SEG technique is used in forming the plug instead of a polysilicon deposition in order to decrease a cell contact resistance. In case of the SEG technique, a temperature for carrying out the plug formation process ranges from about 700° C. to about 1000° C. This temperature range is higher than that of the polysilicon deposition process typically ranging from about 500° C. to about 600° C. Therefore, this SEG technique degrades electrical properties such as a threshold voltage Vt, a drain current Id and a punchthrough phenomenon in the peripheral circuit region.

For this reason, source/drains are formed at both sides of a gate electrode structure in the peripheral circuit region after a contact pad is formed in the cell region through the use of the SEG technique to prevent degradation of electrical properties.

Figure 2:
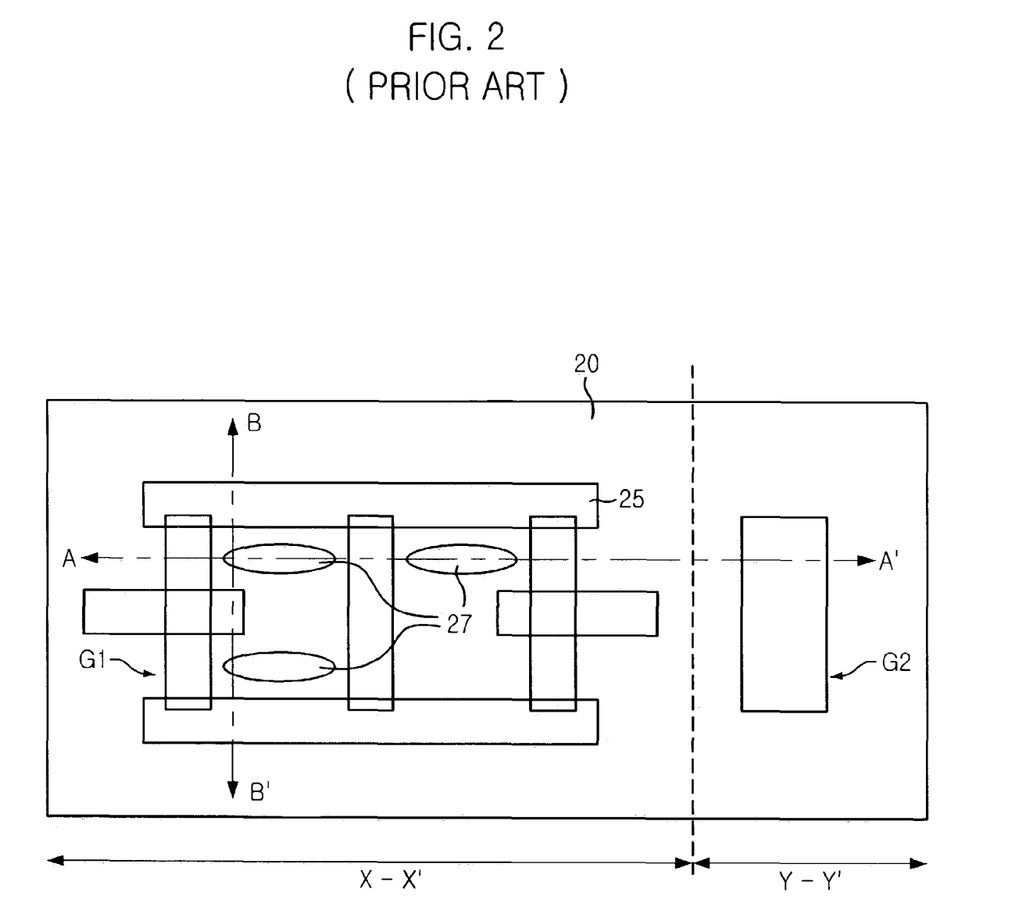
FIG. 2 is a top view of the conventional semiconductor device after a SAC process for forming a plug.

FIG. 2 is a top view showing the conventional semiconductor device after completion of the typical SAC process for forming a plug. As shown, a plurality of insulating patterns 25 are locally arrayed on a substrate 20 in which active regions are formed. A plurality of gate electrodes G1 and G2 are arrayed in a direction of crossing the insulating patterns 25. Herein, the reference numeral 27 is a region opened for forming a plug, i.e., a contact hole, and the X–X' and Y–Y' regions are a cell region and a peripheral circuit region, respectively.

FIGS. 3A to 3D are cross-sectional views of a conventionally fabricated semiconductor device in each direction of the lines A–A' and B–B' shown in FIG. 2.

Figure 3A:
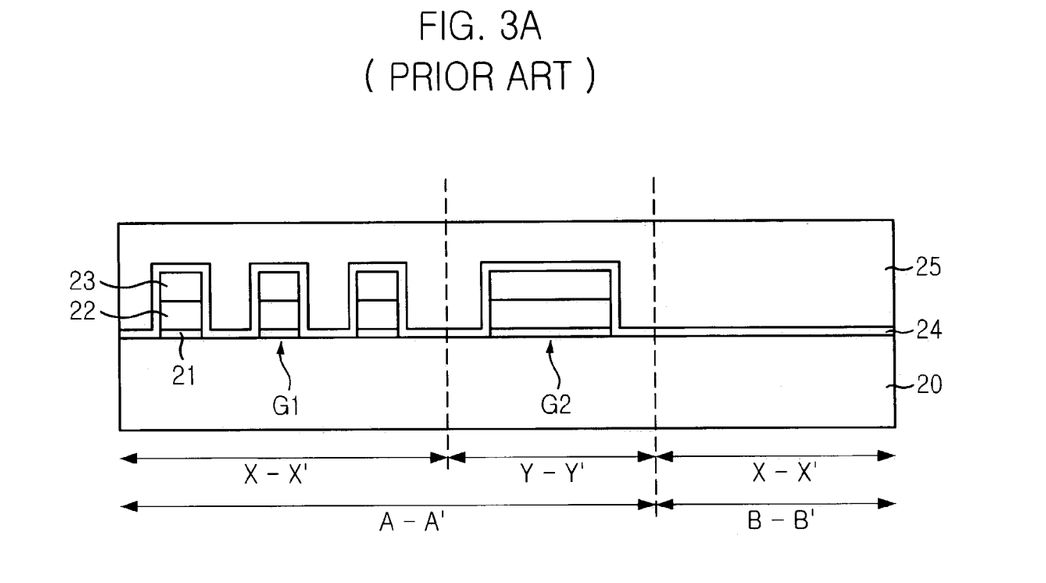
FIGS. 3A to 3D are cross-sectional views of the semiconductor device viewed in each direction of the lines A–A' and B–B' shown in FIG. 1A.

Referring to FIG. 3A, an insulation layer 21 for forming a gate electrode (hereinafter referred to as gate insulation layer), a conductive layer 22 for forming a gate electrode (hereinafter referred to as gate conductive layer) and an insulation layer 23 for a hard mask (hereinafter referred to as hard mask insulation layer) are sequentially deposited on a substrate providing various elements of the semiconductor device. Then, a photo-etching process is performed with use of a gate electrode mask to form a plurality of gate electrodes G1 and G2 having a stack structure of the hard mask insulation layer 23, the gate conductive layer 22 and the gate insulation layer 21.

Herein, the gate insulation layer 21 is an oxide-based layer. The gate conductive layer 22 is a single layer or stacked layer of tungsten, tungsten nitride, or tungsten silicide. Also, the hard mask insulation layer 23 is a nitride-based layer using a silicon nitride layer or a silicon oxynitride layer.

The reason for using the nitride-based material for the hard mask insulation layer 23 is to provide an intended etch profile in the SAC process for forming the plug and simultaneously to prevent losses of the gate electrode patterns G1 and G2 because the nitride-based material has a different etch selectivity from an oxide-based inter-layer insulation layer.

Next, a nitride-based etch stop layer 24 is deposited thinly along a profile containing the gate electrode patterns G1 and G2. An oxide-based insulation layer 25 for insulating inter-layers and isolating the gate electrode patterns G1 and G2 from each other is deposited on an entire surface of the above substrate structure. At this time, the insulation layer 25 is made of boron-phosphorus silicate glass (BPSG).

Figure 3B:
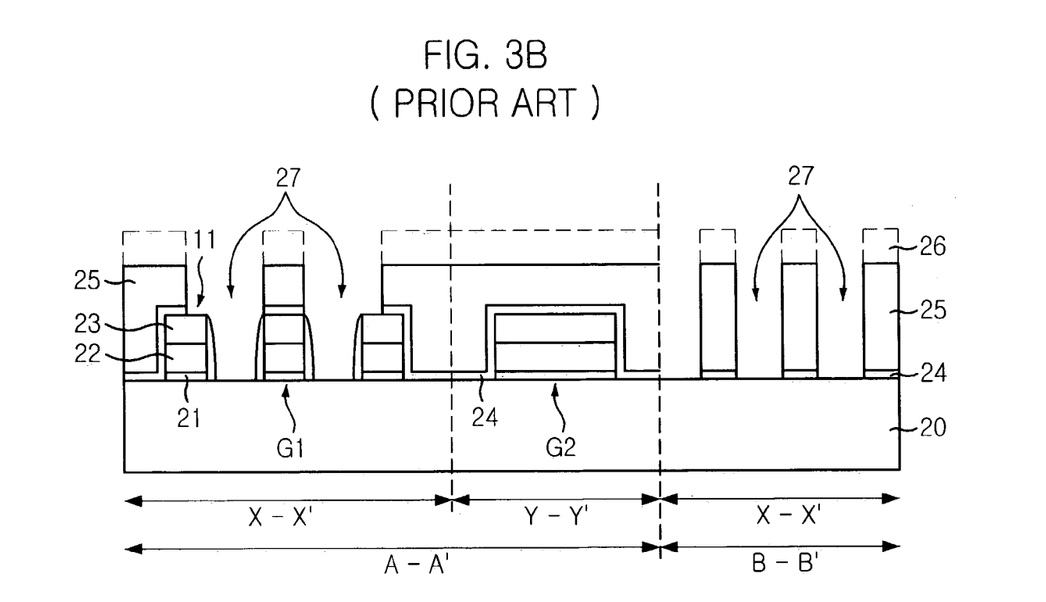

Referring to FIG. 3B, subsequent to the deposition of the insulation layer 25, a photoresist pattern 26, which is a cell contact open mask, is formed on the insulation layer 25. The insulation layer 25 is then selectively etched by using the photoresist pattern 26 as an etch mask to form a plurality of contact holes 27 exposing impurity contact regions, e.g., source/drains, allocated between the gate electrode patterns G1 in the cell region X–X'. The contact holes 27 in the cell region X–X' viewed in a direction of the line B–B' exposes impurity contact regions allocated between the insulating patterns, i.e., the etched insulation layers 25.

A photoresist strip process is performed to remove the photoresist pattern 26, and a cleaning process using a HF-based solution is subsequently performed to remove etch remnants and extend an opened portion of the contact hole 27.

A conductive layer for forming a plug (hereinafter referred to as plug conductive layer) is deposited into the contact holes 27 so as to be electrically connected to an exposed surface of the substrate 20 during the contact hole formation. The plug conductive layer is made of polysilicon or tungsten, and a barrier layer using Ti/TiN can be formed at a bottom of the plug conductive layer.

Figure 3C:
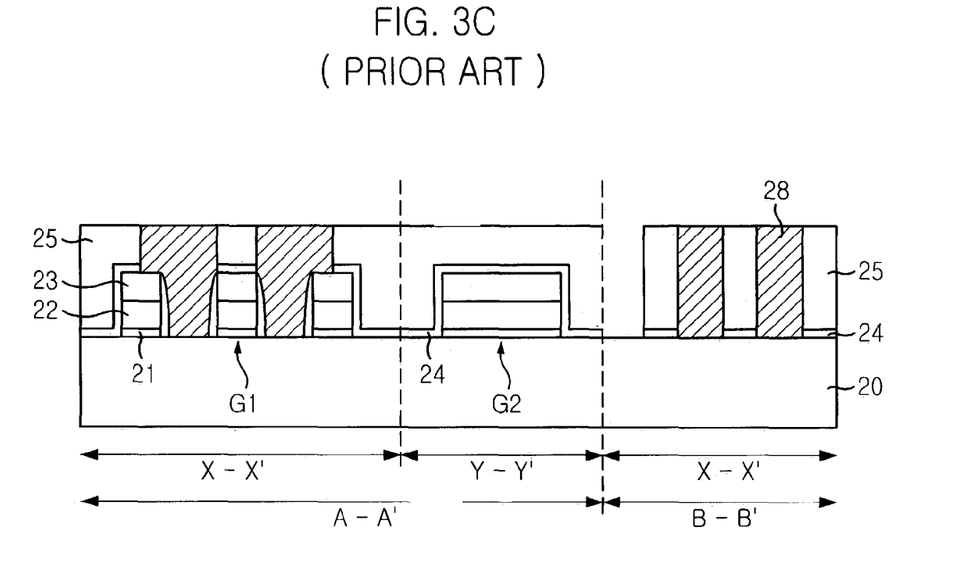

Referring to FIG. 3C, after depositing the plug conductive layer, a chemical mechanical polishing (CMP) process is performed under a target that the insulation layer 25 remains on an upper part of each gate electrode pattern G1 and G2 with a certain thickness. Thereafter, a plurality of plugs 28 isolated from each other by the remaining insulation layer 25 are formed.

Figure 3D:
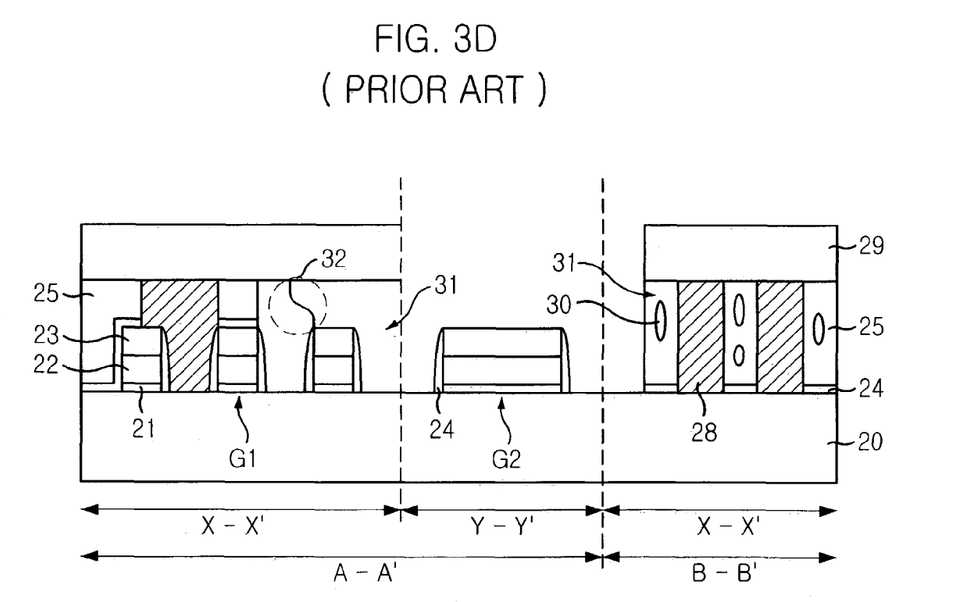

As shown in FIG. 3D, the insulation layer 25 formed in the peripheral circuit region Y–Y' is removed through the use of a wet etching process. More specifically, a photoresist pattern 29 masking solely an upper part of the cell region X–X' is formed. Then, the insulation layer 25 formed in the peripheral circuit region Y–Y' is selectively removed by using buffered oxide etchant (BOE) or hydrofluoric acid (HF).

During the wet etching process, the above wet solution is, however, diffused into the cell region X–X'. This diffusion is denoted as the reference numeral 31. As a result of this diffusion, the insulation layer 25 in the cell region X–X' is excessively etched to thereby expose the plugs 28. This exposure is denoted as the reference numeral 32. Particularly, in case that the insulation layer 25 is made of BPSG, the BPSG has a poor adhesion with the photoresist. Therefore, the wet solution is diffused through interstitial spaces between the BPSG layer, i.e., the insulation layer 25, and the photoresist pattern 29, further resulting in generations of void 30. Furthermore, the void 30 becomes a factor for inducing an electrical short circuit between bit lines during a SAC process for forming a bit line contact because a polishing agent for the CMP process for isolating cells is filled into the voids 30.

SUMMARY OF THE INVENTION

It is, therefore, an object of the present invention to provide a method for fabricating a semiconductor device capable of efficiently preventing defects in a semiconductor device caused by diffusions of a wet solution into a cell region during a removal of an insulation layer in a peripheral circuit region.

In accordance with an aspect of the present invention, there is provided a method for fabricating a semiconductor device, including the steps of: (a) forming a plurality of conductive patterns on a substrate in a cell region and a peripheral circuit region; (b) forming an insulation layer on an entire surface of the resulting structure from the step (a); (c) forming a plurality of plugs in the cell region and simultaneously forming a dummy pattern in a region between the cell region and the peripheral circuit region, each plug and the dummy pattern being contacted to the substrate allocated between the conductive patterns by passing through the insulation layer; (d) forming a photoresist pattern masking the resulting structure in the cell region; and (e) removing the insulation layer in the peripheral circuit region by performing a wet etching process with use of the photoresist pattern as an etch mask to thereby expose a surface of the substrate in the peripheral circuit region.

In accordance with another aspect of the present invention, there is also provided a method for fabricating a semiconductor device, including the steps of: (a) forming a plurality of conductive patterns on a substrate in a cell region and a peripheral circuit region; (b) forming an insulation layer on an entire surface of the resulting structure from the step (a); (c) forming a plurality of plugs in the cell region, each being contacted to the substrate allocated between the conductive patterns by passing through the insulation layer; (d) forming a photoresist pattern masking the resulting structure in the cell region; (e) performing a dry etching process with use of the photoresist pattern as an etch mask to remove partially the insulation layer in the peripheral circuit region; and (f) removing the remaining insulation layer through a wet etching process to thereby expose a surface of the substrate in the peripheral circuit region.

In accordance with still another aspect of the present invention, there is also provided a method for fabricating a semiconductor device, including the steps of: (a) forming a plurality of conductive patterns on a substrate in a cell region and a peripheral circuit region; (b) forming a planarized first insulation layer on an entire surface of the resulting structure from the step (a); (c) forming a second insulation layer on the first insulation layer; (d) forming a plurality of plugs in the cell region, each being contacted to the substrate allocated between the conductive patterns by passing through the first and the second insulation layers; (e) forming a photoresist pattern masking the resulting structure in the cell region; and (f) performing a wet etching process with use of the photoresist pattern as an etch mask to remove the first and the second insulation layers disposed in the peripheral circuit region.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, a method for fabricating a semiconductor device capable of preventing defects in a semiconductor device will be described in the following.

FIGS. 4A to 4D are cross-sectional views of a semiconductor device in each direction of the lines A–A' and B–B' shown like FIG. 1A in accordance with a first preferred embodiment of the present invention.

Figure 4A:
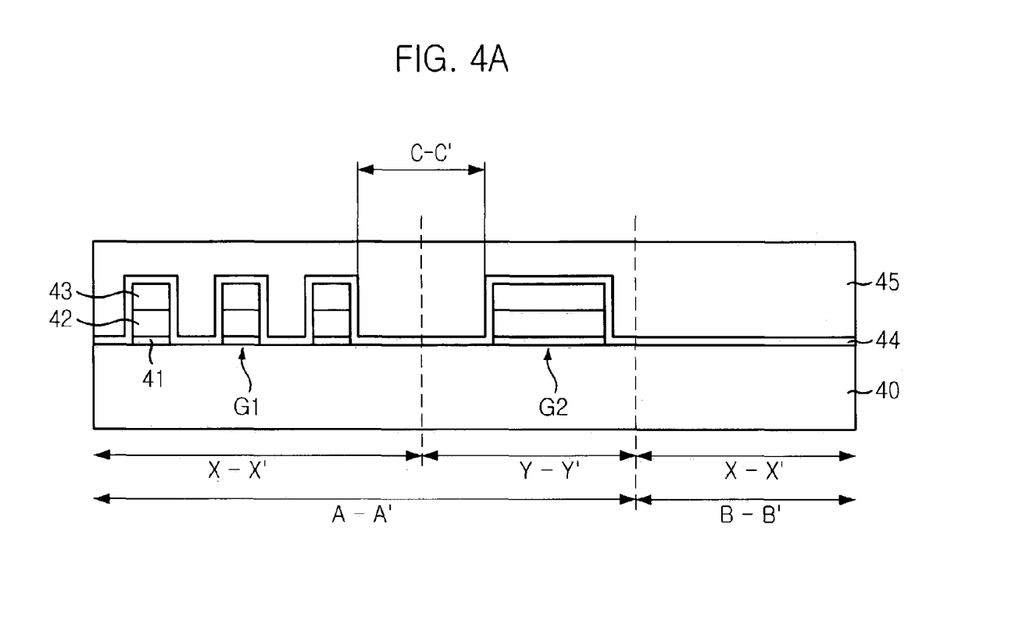
FIGS. 4A to 4D are cross-sectional views of a semiconductor device in each direction of the lines A–A' and B–B' shown like FIG. 1A in accordance with a first preferred embodiment of the present invention.

Referring to FIG. 4A, an insulation layer 41 for forming a gate electrode (hereinafter referred to as gate insulation layer), a conductive layer 42 for forming a gate electrode (hereinafter referred to as gate conductive layer) and an insulation layer for forming a hard mask (hereinafter referred to as hard mask insulation layer) are sequentially deposited on a substrate 40 providing various elements of a semiconductor device. Afterwards, a photo-etching process is performed by using a gate electrode mask in order to form a plurality of gate electrodes G1 and G2 having a stack structure of the hard mask insulation layer 43, the gate conductive layer 42 and the gate insulation layer 41.

At this time, the gate insulation layer 41 is an oxide-based layer. The gate conductive layer 42 is a single layer or stack layer of tungsten, tungsten nitride or tungsten silicide. Also, the hard mask insulation layer 43 is a nitride-based layer such as a silicon nitride layer or a silicon oxynitride layer.

The reason for using the nitride-based material for the hard mask insulation layer 43 is to provide an intended etch profile in the SAC process for forming the plug and simultaneously to prevent losses of the gate electrode patterns G1 and G2 because the nitride-based material has a different etch selectivity from an oxide-based inter-layer insulation layer.

Next, a nitride-based etch stop layer 44 is deposited thinly along a profile containing the gate electrode patterns G1 and G2. An oxide-based insulation layer 45 for insulating interlayers and isolating the gate electrode patterns G1 and G2 from each other is deposited on an entire surface of the above substrate structure. At this time, the insulation layer 45 is a single layer or stacked layer of boron-phosphorus silicate glass (BPSG), tetra-ethyl-ortho silicate (TEOS) or high density plasma (HDP) oxide. Herein, the region C–C' allocated between the cell region X–X' and the peripheral circuit region Y–Y' is designated for a dummy pattern region.

Figure 4B:
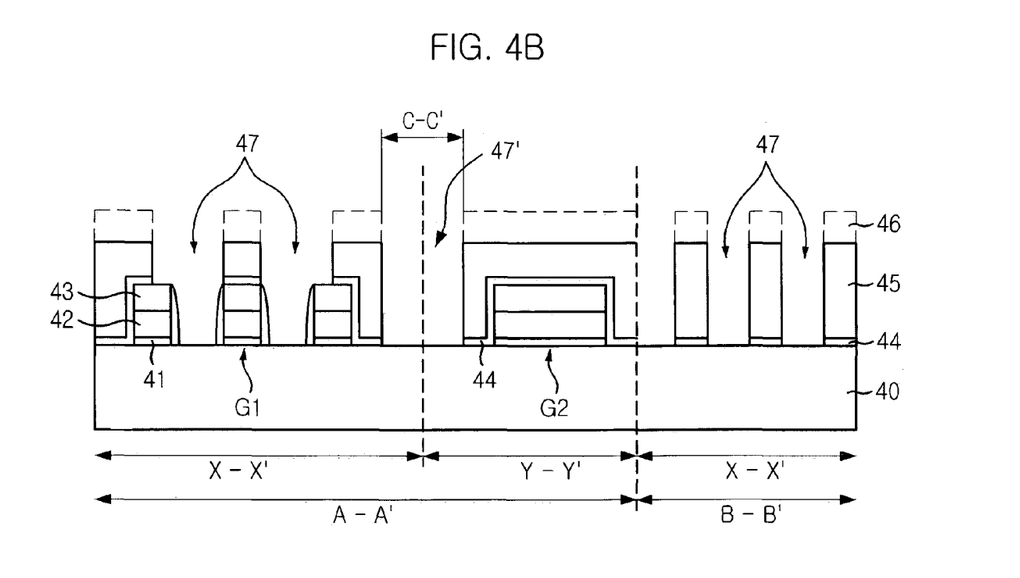

Referring to FIG. 4B, subsequent to the insulation layer 45 deposition, a photoresist pattern 46, which is a cell contact open mask, is formed on the insulation layer 45. Then, the insulation layer 45 viewed in a direction of the line A–A' is selectively etched with use of the photoresist pattern 46 as an etch mask so that a plurality of opening parts 47 exposing substrate regions, e.g., impurity contact regions such like source/drains disposed between the gate electrode patterns G1 and G2 are formed in the cell region X–X'. On the other hand, the opening parts 47 viewed in a direction of the line B–B' expose the substrate region disposed between the insulating patterns, i.e., the etched insulation layer 45. Also, an opening part 47' exposing a surface of the substrate 40 is formed in the region C–C' designated for the dummy patterns. Hereinafter, the region C–C' is referred to as dummy pattern region.

Next, a photoresist strip process is carried out to remove the photoresist pattern 46, and then, a cleaning process is performed to remove etch remnants and extend a bottom portion of the opening parts 47 and 47'.

Figure 4C:
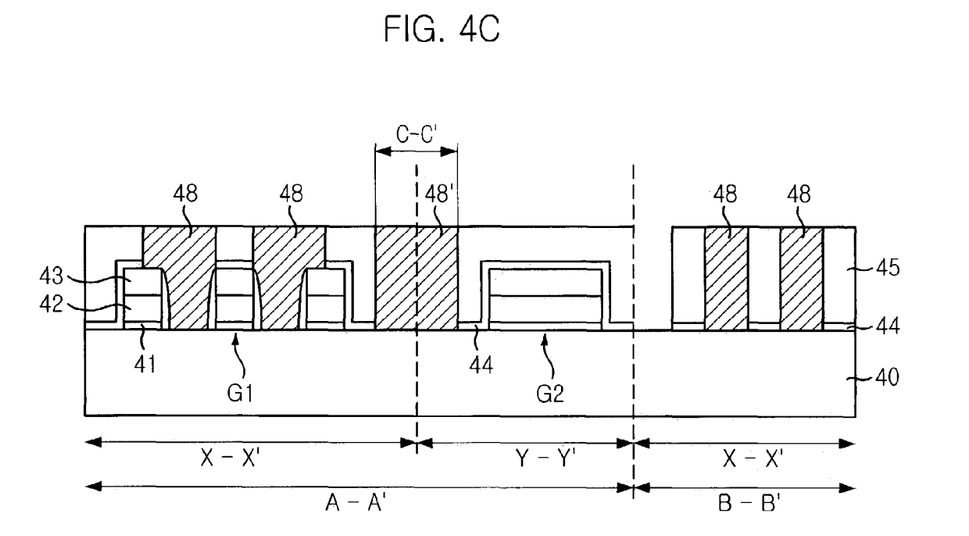

Referring to FIG. 4C, a conductive layer for forming a plug (hereinafter referred to as plug conductive layer) is deposited on the above entire structure so as to be electrically connected to the exposed substrate 40. Afterwards, a CMP process is performed in such a manner that the insulation layer 45 remains on an upper part of the gate electrode patterns G1 and G2 with a certain thickness. From this CMP process, a plurality of plugs 48 and 48' isolated from each other by the insulation layer 45 are formed. The plug conductive layer is made of polysilicon or tungsten, and a barrier layer such as Ti/TiN can be formed at a bottom of the plug conductive layer. It is possible to employ a selective epitaxial growth (SEG) technique for forming the plug conductive layer instead of using the above-described deposition technique.

It is also noted that the plug 48' is formed in the dummy pattern region C–C'. Unlike the plugs 48 formed in the cell region X–X' for making an electrical connection with the impurity contact regions, the plug 48' is for preventing diffusions of a wet solution into the cell region X–X' when the insulation layer 45 in the peripheral circuit region Y–Y' is removed during a subsequent post landing plug source drain (PLSD) process. At this time, the dummy pattern region C–C' has preferably a width ranging from about 1 μm to about 10 μm.

Figure 4D:
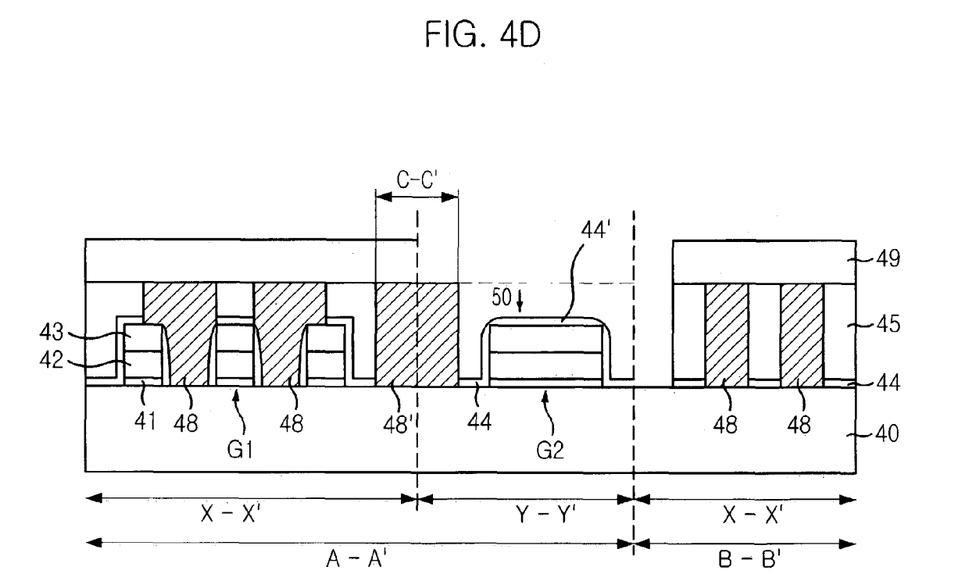

Next, referring to FIG. 4D, the insulation layer 45 in the peripheral circuit region Y–Y' is removed through the use of a wet etching process. This removal of the insulation layer 45 is denoted as the reference numeral 50. In more detail, a photoresist pattern 49 masking an upper part of the cell region X–X' is formed, and the insulation layer 45 in the peripheral circuit region Y–Y' is removed thereafter.

At this time, the wet etching process uses a wet solution such as buffered oxide etchant (BOE) or hydrofluoric acid (HF). As mentioned above, the plug 48' has a function of preventing diffusions of the wet solution into the cell region X–X' during the wet etching process. Hereinafter, the plug 48' is referred to as a dummy plug. Also, the wet solution is mainly used for etching an oxide layer. Therefore, even if the dummy plug 48' is slightly attacked by the diffused wet solution, it is still possible to prevent the diffusion of the wet solution into the cell region X–X'. Also, since the attacked plug 48' is the dummy plug, it does not affect device characteristics.

FIGS. 5A to 5E are cross-sectional views of a semiconductor device viewed in each direction of the lines A–A' and B–B' shown like in FIG. 1A in accordance with a second preferred embodiment of the present invention.

Figure 5A:
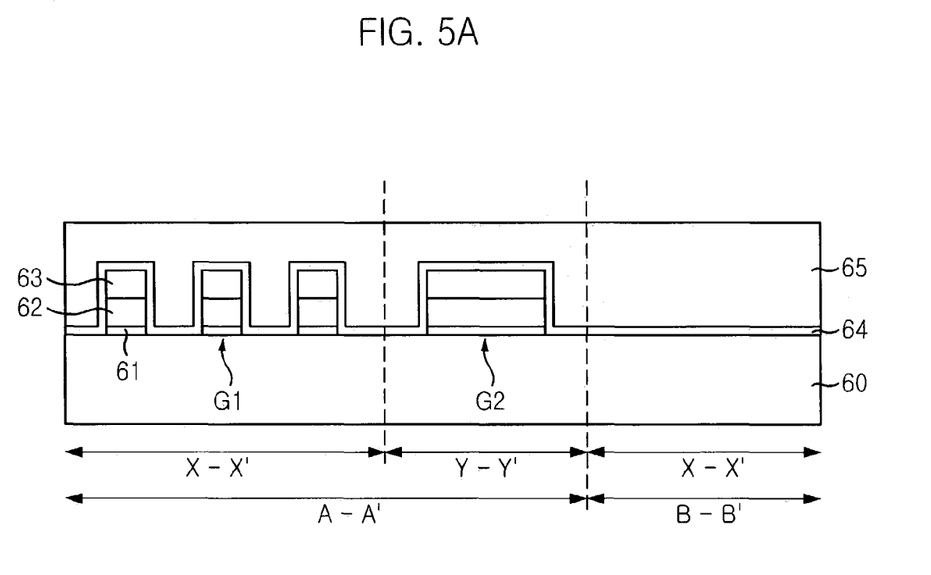
FIGS. 5A to 5E are cross-sectional views of a semiconductor device in each direction of the lines A–A' and B–B' shown like in FIG. 1A in accordance with a second preferred embodiment of the present invention.

Referring to FIG. 5A, a gate insulation layer 61, a gate conductive layer 62 and a hard mask insulation layer 63 are sequentially deposited on a substrate 60 providing various elements of a semiconductor device. Afterwards, a photo-etching process is performed by using a gate electrode mask in order to form a plurality of gate electrodes G1 and G2 having a stack structure of the hard mask insulation layer 63, the gate conductive layer 62 and the gate insulation layer 61.

At this time, the gate insulation layer 61 is an oxide-based layer. The gate conductive layer 62 is a single layer or stack layer of tungsten, tungsten nitride or tungsten silicide. Also, the hard mask insulation layer 63 is a nitride-based layer such as a silicon nitride layer or a silicon oxynitride layer.

The reason for using the nitride-based material for the hard mask insulation layer 63 is to provide an intended etch profile in the SAC process for forming the plug and simultaneously to prevent losses of the gate electrode patterns G1 and G2 because the nitride-based material has a different etch selectivity from an oxide-based inter-layer insulation layer.

Next, a nitride-based etch stop layer 64 is deposited thinly along a profile containing the gate electrode patterns G1 and G2. An oxide-based insulation layer 65 for insulating interlayers and isolating the gate electrode patterns G1 and G2 from each other is deposited on an entire surface of the above substrate structure. At this time, the insulation layer 65 is a single layer or stacked layer of BPSG, boron-silicate glass (BSG), phosphorus-silicate glass (PSG), TEOS, HDP oxide or an advanced planarization layer (APL).

Figure 5B:
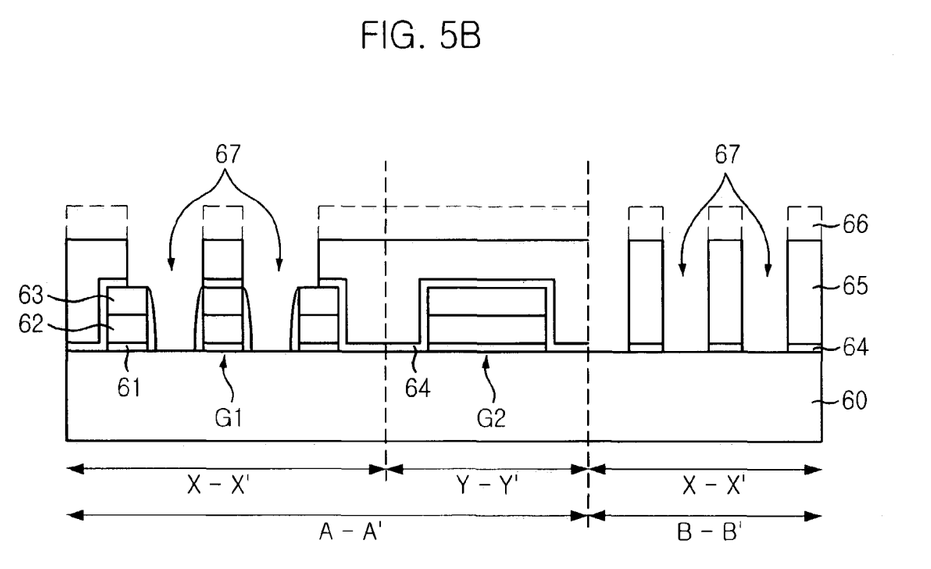

Referring to FIG. 5B, subsequent to the insulation layer 65 deposition, a photoresist pattern 66, which is a cell contact open mask, is formed on the insulation layer 65. Then, the insulation layer 65 viewed in a direction of the line A–A' is selectively etched with use of the photoresist pattern 66 as an etch mask so that a plurality of opening parts 67 exposing substrate regions, e.g., impurity contact regions such like source/drains disposed between the gate electrode patterns G1 are formed in the cell region X–X'. On the other hand, the opening parts 67 viewed in a direction of the line B–B' expose the substrate region disposed between the insulating patterns, i.e., the etched insulation layer 65.

Next, a photoresist strip process is carried out to remove the photoresist pattern 66, and then, a cleaning process is performed to remove etch remnants.

Figure 5C:
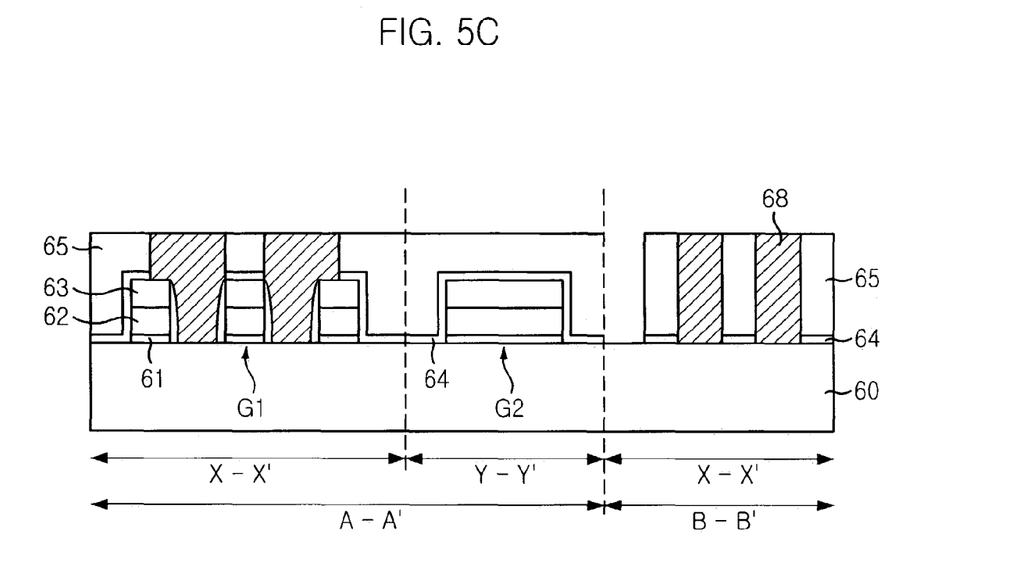

Referring to FIG. 5C, a plug conductive layer is deposited on the above entire structure so as to be electrically connected to the exposed substrate 60. Herein, the plug conductive layer is made of polysilicon or tungsten, and a barrier layer such as Ti/TiN can be formed at a bottom of the plug conductive layer. Afterwards, a CMP process is performed in such a manner that the insulation layer 65 remains on an upper part of the gate electrode patterns G1 and G2 with a certain thickness. From this CMP process, a plurality of plugs 68 isolated from each other by the insulation layer 65 are formed.

Figure 5D:
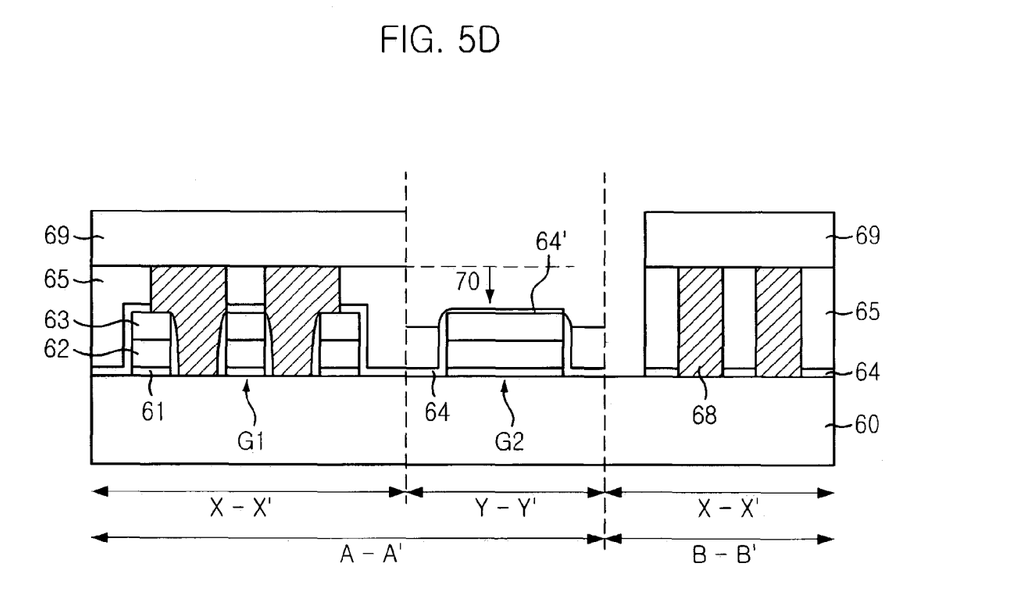

Next, referring to FIG. 5D, a partial portion of the insulation layer 45 in the peripheral circuit region Y–Y' is removed through the use of a dry etching process. This partial removal of the insulation layer 65 is denoted as the reference numeral 70. Tn more detail, a photoresist pattern 69 masking an upper part of the cell region X–X' is formed, and the insulation layer 65 in the peripheral circuit region Y–Y' is selectively removed by using the photoresist pattern 69 as an etch mask. Herein, for the dry etching process, a plasma using a mixed gas of $C_xF_y$, where x and y ranges from about 1 to about 10, $C_aH_bF_c$, where a, b and c ranges from about 1 to about 10, and $O_2$ is used. At this time, such inert gas as He, Ne, Ar or Xe can be used additionally to enhance reliability of an etch profile. Also, the reference numeral 64' illustrates that the etch stop layer 64 is partially etched during the dry etching process.

Figure 5E:
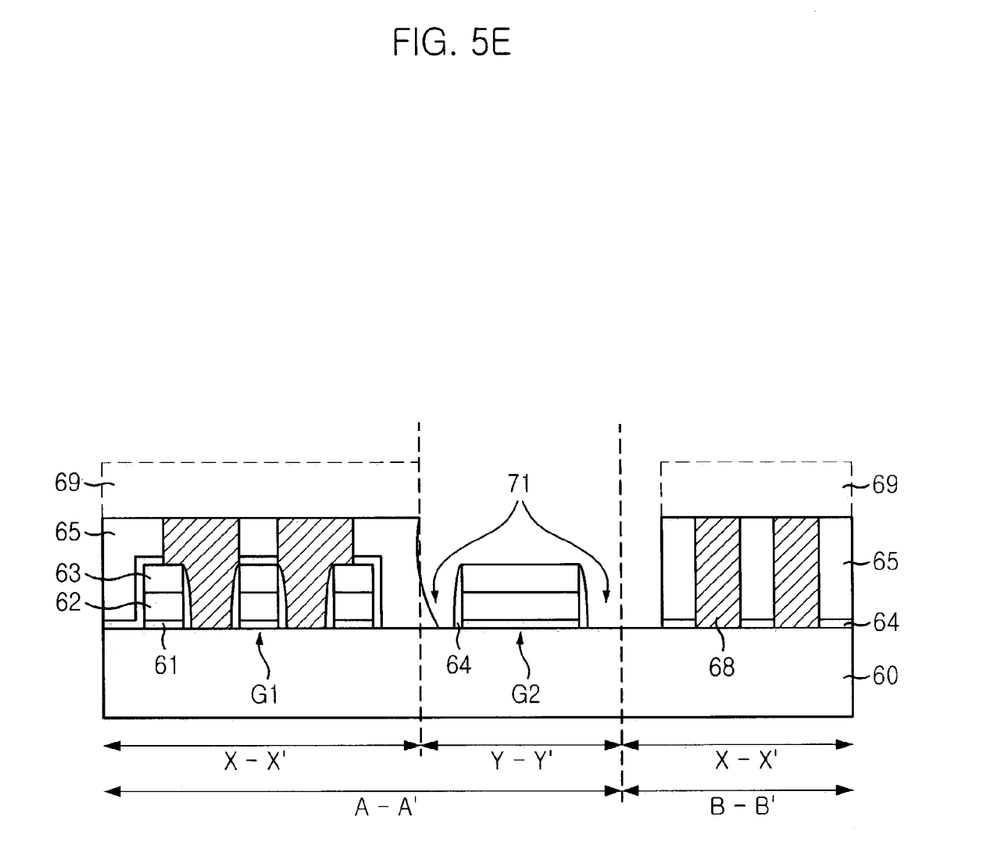

Referring to FIG. 5E, the dry etching process, a wet etching process is performed to remove the remaining insulation layer 65 in the peripheral circuit region Y–Y'. This removal is denoted as the reference numeral 71. At this time, such wet solution as BOE or HF is used in the wet etching process.

By performing the dry etching process having an anisotropic etching property prior to the wet etching process, it is possible to shorten a period for performing the wet etching process. This effect further prevents diffusions of the wet solution into the cell region X–X' through the insulation layer 65.

FIGS. 6A to 6D are cross-sectional views of a semiconductor device in each direction of the lines A–A' and B–B' shown like in FIG. 1A in accordance with a third preferred embodiment of the present invention.

Figure 6A:
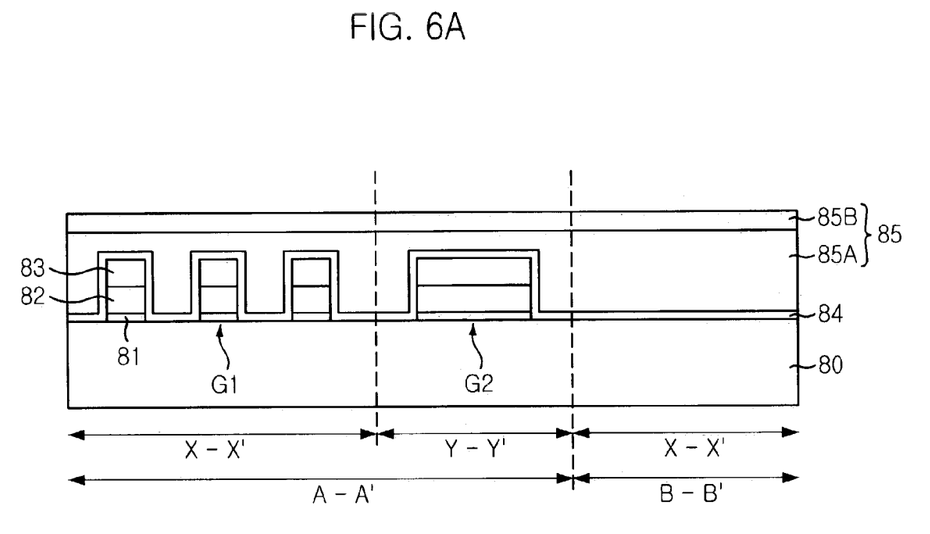
FIGS. 6A to 6D are cross-sectional views of a semiconductor device in each direction of the lines A–A' and B–B' shown like FIG. 1 in accordance with a third preferred embodiment of the present invention.

Referring to FIG. 6A, a gate insulation layer 81, a gate conductive layer 82 and a hard mask insulation layer 83 are sequentially deposited on a substrate 80 providing various elements of a semiconductor device. Afterwards, a photo-etching process is performed by using a gate electrode mask in order to form a plurality of gate electrodes G1 and G2 having a stack structure of the hard mask insulation layer 83, the gate conductive layer 82 and the gate insulation layer 81.

At this time, the gate insulation layer 81 is an oxide-based layer. The gate conductive layer 82 is a single layer or stack layer of tungsten, tungsten nitride or tungsten silicide. Also, the hard mask insulation layer 83 is a nitride-based layer such as a silicon nitride layer or a silicon oxynitride layer.

The reason for using the nitride-based material for the hard mask insulation layer 83 is to provide an intended etch profile in the SAC process for forming the plug and simultaneously to prevent losses of the gate electrode patterns G1 and G2 because the nitride-based material has a different etch selectivity from an oxide-based inter-layer insulation layer.

Next, a nitride-based etch stop layer 84 is deposited thinly along a profile containing the gate electrode patterns G1 and G2. Then, a double insulation layer 85 including a first insulation layer 85A and a second insulation layer 85B is deposited on an entire surface of the above substrate structure. At this time, the double insulation layer 85 uses an oxide-based material. Also, the double insulation layer 85 is for insulating inter-layers and isolating the gate electrode patterns G1 and G2 from each other. The reason for forming the double insulation layer 85 is because a typically used insulation material, e.g., BPSG, has a poor adhesion with the photoresist pattern.

In more detail of the double insulation layer 85 deposition, the first insulation layer 85A made of BPSG is deposited on the entire substrate structure and is subsequently planarized. The second insulation layer 85B made of TEOS or HDP oxide is deposited thereon. The TEOS and the HDP oxide have a better adhesion with the photoresist pattern than the BPSG.

Figure 6B:
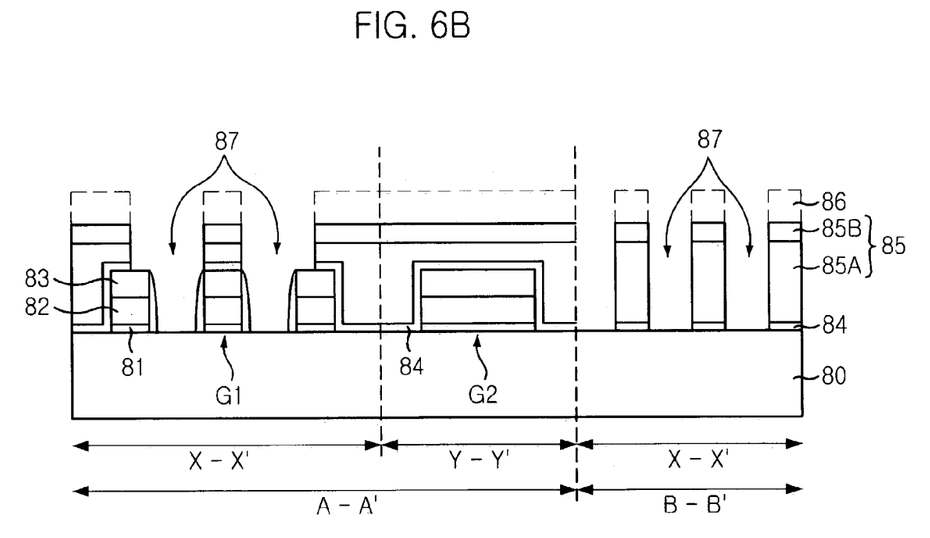

Referring to FIG. 6B, subsequent to the double insulation layer 85 deposition, a photoresist pattern 86, which is a cell contact open mask, is formed on the second insulation layer 85B. Then, the first and the second insulation layers 85A and 85B viewed in a direction of the line A–A' are selectively etched with use of the photoresist pattern 86 as an etch mask so that a plurality of opening parts 87 exposing substrate regions, e.g., impurity contact regions such like source/drains disposed between the gate electrode patterns G1 are formed in the cell region X–X'. On the other hand, the opening parts 87 viewed in a direction of the line B–B' expose the substrate regions disposed between the insulating patterns, i.e., the etched double insulation layer 85.

Next, a photoresist strip process is carried out to remove the photoresist pattern 86, and then, a cleaning process is performed to remove etch remnants and extend an opened portion of the opening part 87. At this time, compared to the single layer structure of the insulation layer, this double insulation layer 85 prevents an excessive etching of the insulation layer.

Figure 6C:
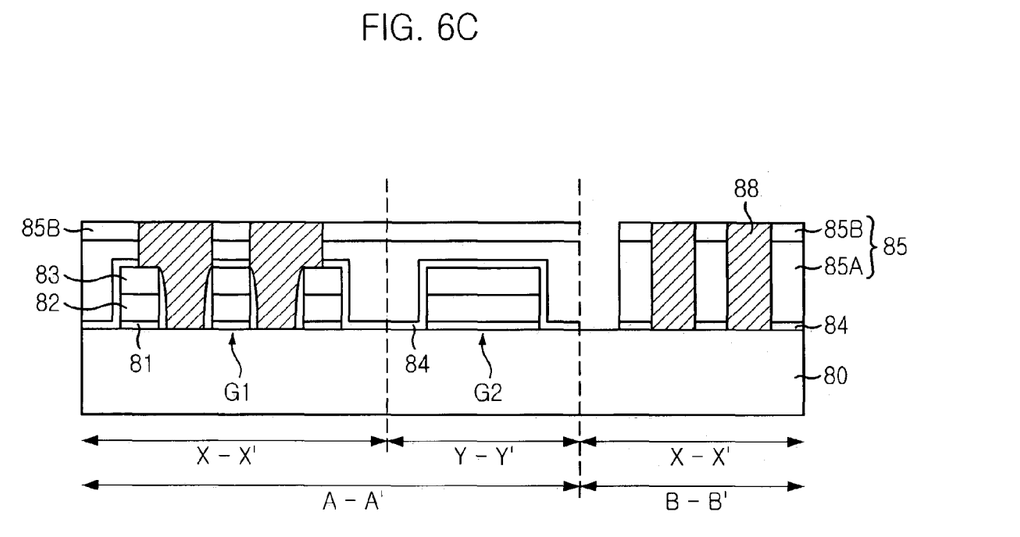

Referring to FIG. 6C, a plug conductive layer is deposited on the above entire structure so as to be electrically connected to the exposed substrate 80. Herein, the plug conductive layer is made of polysilicon or tungsten, and a barrier layer such as Ti/TiN can be formed at a bottom of the plug conductive layer. Afterwards, a CMP process is performed in such a manner that the second insulation layer 85B remains on an upper part of the gate electrode patterns G1 and G2 with a certain thickness. From this CMP process, a plurality of plugs 88 isolated from each other by the insulation layer 85 are formed.

Figure 6D:
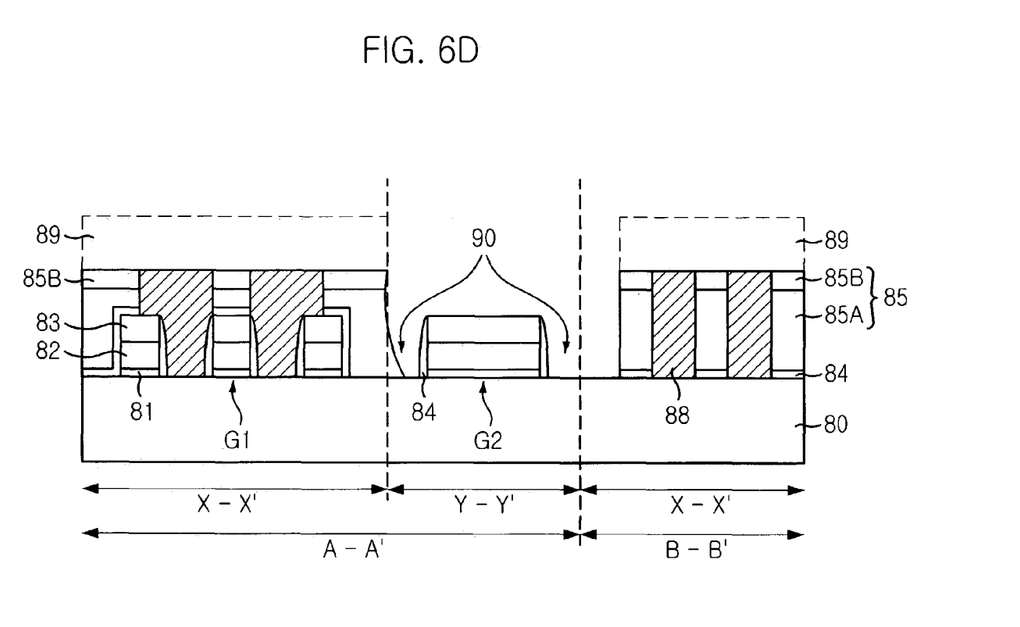

Next, referring to FIG. 6D, the first and the second insulation layers 85A and 85B in the peripheral circuit region Y–Y' are removed through the use of a wet etching process. This removal of the double insulation layer 85 is denoted as the reference numeral 90. In more detail, a photoresist pattern 89 masking an upper part of the cell region X–X' is formed, and the first and the second insulation layers 85A and 85B in the peripheral circuit region Y–Y' are selectively removed by using the photoresist pattern 89 as an etch mask. Herein, such wet solution as BOE or HF is used in the wet etching process.

As described above, during the wet etching process, the wet solution is possibly diffused into interstitial spaces between the insulation layer and the photoresist pattern because of a poor adhesion of the typical insulation material, i.e., BPSG, with the photoresist. This diffused wet solution results in defects in a semiconductor device. To solve this problem, three different methods are suggested in accordance with the present invention as the following:

First, as shown in the first preferred embodiment of the present invention, the dummy pattern is formed between the cell and the peripheral circuit regions when the plugs for cell contacts are formed.

Second, as shown in the second preferred embodiment of the present invention, the insulation layer is partially removed through the dry etching process having an anisotropic etching property, and then, the remaining insulation layer is removed through the wet etching process. As a result of the partial removal of the insulation layer, it is possible to shorten a period for performing the wet etching process, and thereby preventing the diffusions of the wet solutions.

Third, as shown in the third preferred embodiment of the present invention, the insulation layer is formed with double layers since the diffusions of the wet solution is also caused by a poor adhesion between the photoresist and the insulation layer typically made of BPSG. Instead of using merely the BPSG, such material as HDP oxide or TEOS having a good adhesiveness with the photoresist, is deposited on the BPSG layer to thereby prevent the diffusions of the wet solutions into the interstitial spaces between the photoresist pattern and the insulation layer.

In accordance with the first to the third preferred embodiment of the present invention, it is possible to prevent deterioration of device characteristics resulted from the diffusions of the wet solution into the cell region during the removal of the insulation layer in the peripheral circuit region. With this prevention, it is ultimately possible to increase yields of the semiconductor device.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
    (a) forming a plurality of conductive patterns on a substrate in a cell region and a peripheral circuit region;
    (b) forming an insulation layer on an entire surface of the resulting structure from the step (a);
    (c) forming a plurality of plugs in the cell region and simultaneously forming a dummy pattern in a region between the cell region and the peripheral circuit region, each plug and the dummy pattern being contacted to the substrate allocated between the conductive patterns by passing through the insulation layer;
    (d) forming a photoresist pattern masking the resulting structure in the cell region; and
    (e) removing the insulation layer in the peripheral circuit region by performing a wet etching process with use of the photoresist pattern as an etch mask to thereby expose a surface of the substrate in the peripheral circuit region.

2. The method as recited in claim 1, wherein the region for the dummy pattern has a width ranging from about 1 μm to about 10 μm.

3. The method as recited in claim 1, wherein the insulation layer is made of any material selected from a group consisting of boron-phosphorous silicate glass (BPSG), high density plasma (HDP) oxide or tetra-ethyl-ortho silicate (TEOS) glass.

4. The method as recited in claim 1, wherein the conductive pattern is a gate electrode pattern.

5. The method as recited in claim 1, wherein the wet etching process uses buffered oxide etchant (BOE) or hydrofluoric acid (HF).

6. A method for fabricating a semiconductor device, comprising the steps of:
    (a) forming a plurality of conductive patterns on a substrate in a cell region and a peripheral circuit region;
    (b) forming an insulation layer on an entire surface of the resulting structure from the step (a);
    (c) forming a plurality of plugs in the cell region, each being contacted to the substrate allocated between the conductive patterns by passing through the insulation layer;
    (d) forming a photoresist pattern masking the resulting structure in the cell region;
    (e) performing a dry etching process with use of the photoresist pattern as an etch mask to remove partially the insulation layer in the peripheral circuit region; and
    (f) removing the remaining insulation layer through a wet etching process to thereby expose a surface of the substrate in the peripheral circuit region.

7. The method as recited in claim 6, wherein the conductive pattern is a gate electrode pattern.

8. The method as recited in claim 6, wherein a plasma using a mixed gas of $C_xF_y$, where x and y ranges from about 1 to about 10, $C_aH_bF_c$, where a, b and c ranges from about 1 to about 10, and $O_2$ is used in the dry etching process.

9. The method as recited in claim 6, wherein the insulation layer is made of any material selected from a group consisting of boron-phosphorous silicate glass (BPSG), boron-silicate glass (BSG), phosphorus-silicate glass (PSG), high density plasma (HDP) oxide, tetra-ethyl-ortho silicate (TEOS) glass or advanced planarization layer (APL).

10. The method as recited in claim 6, wherein the dry etching process uses additionally an inert gas.

11. The method as recited in claim 6, wherein the wet etching process uses buffered oxide etchant (BOE) or hydrofluoric acid (HF).

12. A method for fabricating a semiconductor device, comprising the steps of:
    (a) forming a plurality of conductive patterns on a substrate in a cell region and a peripheral circuit region;
    (b) forming a planarized first insulation layer on an entire surface of the resulting structure from the step (a);
    (c) forming a second insulation layer on the first insulation layer;
    (d) forming a plurality of plugs in the cell region, each being contacted to the substrate allocated between the conductive patterns by passing through the first and the second insulation layers;
    (e) forming a photoresist pattern masking the resulting structure in the cell region; and
    (f) performing a wet etching process with use of the photoresist pattern as an etch mask to remove the first and the second insulation layers disposed in the peripheral circuit region.

13. The method as recited in claim 12, wherein the first insulation layer is made of BPSG and the second insulation layer is made of TEOS or HDP oxide.

14. The method as recited in claim 12, wherein the conductive pattern is a gate electrode pattern.

15. The method as recited in claim 12, wherein the wet etching process uses a buffered oxide etchant (BOE) or hydrofluoric acid (HF).

* * * * *